US008620628B2

(12) United States Patent
Yu et al.

(10) Patent No.: US 8,620,628 B2
(45) Date of Patent: *Dec. 31, 2013

(54) RUN-TIME TUNABLE SAMPLE TIME IN PROGRAMMING OR MODELING ENVIRONMENTS (75) Inventors: Biao Yu, Ayer, MA (US); Matthew Englehart, Olmsted Township, OH (US)

(73) Assignee: The MathWorks, Inc., Natick, MA (US)

( * ) Notice: Subject to any disclaimer, the term of this patent is extended or adjusted under 35 U.S.C. 154(b) by 79 days.

This patent is subject to a terminal disclaimer.

(21) Appl. No.: 11/880,954

(22) Filed: Jul. 24, 2007

(65) Prior Publication Data
US 2007/0271083 A1 Nov. 22, 2007

Related U.S. Application Data (63) Continuation of application No. 11/305,907, filed on Dec. 19, 2005, now Pat. No. 8,065,117.

(51) Int. Cl.
*G06F 7/60* (2006.01)
*G06F 9/45* (2006.01)

(52) U.S. Cl.
USPC .............................................. 703/2; 703/22

(58) Field of Classification Search
USPC ........................................................ 703/2, 22
See application file for complete search history.

(56) References Cited

U.S. PATENT DOCUMENTS

| | | | |
|---|---|---|---|
| 7,069,517 B2 * | 6/2006 | Washington et al. | 715/763 |
| 7,162,387 B2 * | 1/2007 | Johnson et al. | 702/123 |
| 7,246,056 B1 | 7/2007 | Brewton | |
| 7,558,719 B1 * | 7/2009 | Donlin | 703/14 |
| 2004/0210592 A1 | 10/2004 | Ciolfi et al. | |
| 2004/0230945 A1 * | 11/2004 | Bryant et al. | 717/106 |
| 2005/0055666 A1 * | 3/2005 | Kornerup et al. | 717/105 |
| 2005/0216248 A1 * | 9/2005 | Ciolfi et al. | 703/22 |
| 2006/0248023 A1 * | 11/2006 | Caprini et al. | 705/400 |

OTHER PUBLICATIONS

National Instruments—"LabVIEW, Simulation Module User Manual," retrieved online at: http://www.ni.com/pdf/manuals/371013c.pdf (2005).
The MathWorks, "Simulink, Model-Based and System-Based Design, Writing S-Functions, Version 5," retrieved online at: http://math.carleton.ca/old/help/matlab/MathWorks_R13Doc/pdf_doc/simulink/sfunctions.pdf (1998-2002).
International Search Report for Application No. PCT/US2006/048431, dated Dec. 11, 2007.
European Office Action for Application No. 11179211.5, 4 pages, dated Sep. 19, 2012.
European Search Report for Application No. 11179211.5, dated Oct. 28, 2011.

* cited by examiner

*Primary Examiner* — Kamini S Shah
*Assistant Examiner* — Juan Ochoa
(74) *Attorney, Agent, or Firm* — Nelson Mullins Riley & Scarborough LLP (57) ABSTRACT

Programming or modeling environments in which programs or models are simulated or executed with tunable sample times are disclosed. The tunable sample times can be changed during the simulation or execution of the programs or models without recompiling the programs or models. The sample times are parameterized and the value of the sample times is changed during the simulation or execution of the programs or models. The sample times may be changed manually by a user. Alternatively, the sample times may be automatically changed by programmatically defining when and how the sample times are determined.

36 Claims, 6 Drawing Sheets

RUN-TIME TUNABLE SAMPLE TIME IN PROGRAMMING OR MODELING ENVIRONMENTS

RELATED APPLICATIONS

This application claims the benefit under 35 U.S.C. §120 as a continuation of U.S. Non-provisional application Ser. No. 11/305,907, filed Dec. 19, 2005, entitled "RUN-TIME TUNABLE SAMPLE TIME IN PROGRAMMING OR MODELING ENVIRONMENTS," the entire disclosure of which is hereby incorporated by reference for all purposes.

FIELD OF THE INVENTION

The present invention relates to programming or modeling environments, in particular to methods, systems and mediums for providing a run-time tunable sample time in the programming or modeling environments.

BACKGROUND OF THE INVENTION

Various classes of block diagram models describe computations that can be performed on application-specific or general purpose computing hardware, such as a computer, microcontroller, FPGA, and custom hardware. Classes of such block diagram models may include time-based block diagrams such as those found within Simulink® from The MathWorks, Inc. of Natick, Mass., state-based and flow diagrams such as those found within Stateflow® from The MathWorks, Inc. of Natick, Mass., entity-flow network diagrams such as SimEvents from The MathWorks, Inc. of Natick, Mass., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages such as Simulink® from The MathWorks, Inc. Such packages provide sophisticated software platforms with a rich suite of support tools that makes the analysis and design of dynamic systems efficient, methodical, and cost-effective.

The block diagrams are not exclusively used for representing time-based dynamic systems but also for other models of computation. For instance, flow-charts are block diagrams used to capture process flow and are not generally suitable for describing dynamic system behavior. Data flow block diagrams are block diagrams that describe a graphical programming paradigm where the availability of data (often thought of as tokens) is used to initiate the execution of blocks, where a block represents an operation and a line represents execution dependency describing the direction of data flowing between blocks. As used herein, the term block diagrams means time-based block diagrams used in the context of dynamic systems except as otherwise noted.

A time-based block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant. The source block of a signal writes to the signal at a given time instant when its system equations are solved. The destination blocks of this signal read from the signal when their system equations are being solved. The block diagram includes a plurality of blocks, lines and ports that are interconnected. Those skilled in the art will recognize that the term "blocks" does not refer exclusively to elemental dynamic systems but may also include other modeling elements that aid in readability and modularity of block diagrams.

Put another way, block diagram models are time-based relationships between signals and state variables representative of a dynamic system. The solution (computation of system response) of the model is obtained by evaluating these relationships at discrete instants in time, where time starts at a user-specified "start time" and either ends at a user-specified "stop time" or based on evaluating a criterion that may involve model and system quantities. The discrete instants in time are separated time intervals, defined as the "sample time." Signals represent quantities that change over time, and these quantities are defined for all points in time between the block diagram's start and stop time when the signal is part of an enabled aspect of the model. The relationships between signals and state variables are defined by sets of equations represented by blocks. These equations define a relationship between the input signals, output signals, state, and time.

In conventional simulation and code generation technology, the sample time(s) of a model cannot be modified during the simulation of a model, and must be specified before the simulation and code generation of the model. Simulation results and generated code are not valid to other systems that have different sample times. In a system running at multiple sample times, a base rate sample time generally refers to a fundamental sample time that is the fastest in the system. Sub-rate sample times refer to the other sample times that are integer multiples of the base sample time. If any of the sample times (base rate or sub-rate sample time) change, the user must re-compile the model to simulate and generate code for the model. Although all sample times must be invariant during simulation and execution of generated code in the conventional technology, sometimes tunable sample times that can be modified during the simulation are needed.

SUMMARY OF THE INVENTION

The present invention provides programming or modeling environments in which programs or models are simulated or executed with one or more run-time tunable sample times. The run-time tunable sample times can be changed during the simulation or execution of the programs or models without recompiling the programs or models. The present invention parameterizes sample times and determines the value of the sample times during the simulation or execution of the programs or models. The sample times may be determined manually by a user. Alternatively, the sample times may be automatically determined by programmatically defining when and how the sample times are determined. The present invention may provide a sample time tuning element, such as a sample time tuning block, to decide when and how sample times change and hence are automatically tuned in a program or model.

In accordance with one aspect of the present invention, a method provides one or more run-time tunable sample times in a modeling environment. The method provides one or more sample times of the model for when the model is executed. The method enables the value of the one or more sample times to be changed at the run-time of a model.

In another aspect of the invention, a system provides one or more run-time tunable sample times in a modeling environment. The system includes a memory space for storing the one or more sample times specifying times when at least a portion of the model or its generated code is executed. The value of the one or more sample times can be changed at the run-time of the model or its generated code.

In another aspect of the invention, a medium is provided for holding instructions executed in a computer to perform a method of providing one or more run-time tunable sample times in a modeling or execution environment. The method includes the step of providing one or more sample times. The method also includes the step of enabling the value of the one or more sample times to be changed at the run-time of a model.

With the run-time tunable sample time of the present invention, a user can develop a tunable system robust to task overrun, optimize computation loads for control algorithms with multiple modes, and support adaptive control schemes that automatically tune sample times to achieve optimal performance.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides a programming or modeling environment in which a program or model is simulated/executed or code is generated and executed for the model. The terms "program/programming" and "model/modeling" will be used interchangeably in the description of the illustrative embodiment. In the description of the illustrative embodiment, the simulation of the program/model is also referred to as the execution of the program/model.

The illustrative embodiment will be described below solely for illustrative purposes relative to a time-based block diagram environment. Although the illustrative embodiment will be described relative to the time-based block diagram environment, one of skill in the art will appreciate that the present invention may apply to other programming/modeling environments, including state-based and flow diagram environments, data flow diagram environments, event-based, circuits, physics modeling, entity flow diagram environments, and Unified Modeling Language (UML) environments.

The illustrative embodiment will also be described below relative to a Simulink® model, a time-based block diagram from The MathWorks, Inc. of Natick, Mass. Nevertheless, those of skill in the art will appreciate that the present invention may be practiced relative to models implemented in other modeling environments, including but not limited to LabVIEW from National Instruments Corporation of Austin, Tex., Rational Rose from IBM of White Plains, N.Y., Gedae, from Gadae, Inc. of Moorestown, N.J., Dymola from Dynasim AB of Sweden, Scade from Esterel Technologies Inc. of Mountain View of CA, TargetLink from dSPACE of Germany, HyVisual or any other Ptolemy based tools, ModelSim from Mentor Graphics of Wilsonville, Oreg., Statemate from I-Logic Inc. of Andover, Mass., etc.

The illustrative embodiment of the present invention provides a block diagram environment in which a block diagram or its generated code is executed with one or more tunable sample times. The tunable sample times can be changed during the execution of the block diagram or its generated code without recompiling the block diagram or generating its code. The illustrative embodiment parameterizes the sample times and determines the values of the sample times during the execution of the block diagram or its generated code. The user may define the attributes of the sample times, such as the task priority, the tunability, and the initial value of the sample times.

The sample times may be determined manually by the user. Alternatively, the sample times may be automatically determined by programmatically defining when and how the sample times are determined. The illustrative embodiment may provide a sample time tuning block to decide when and how sample times change and hence are automatically tuned. Sample time changes can be signal driven, event driven, or time driven. For example, sample times can change during system power up, when a specific event occurs, or they can constantly change. The illustrative embodiment may provide information on the range of the sample times that ensures the system stability so that the sample times can be tuned within the range of the system stability. In the illustrative embodiment, the sample times satisfy system scheduler requirements and cannot change randomly.

Figure 1:
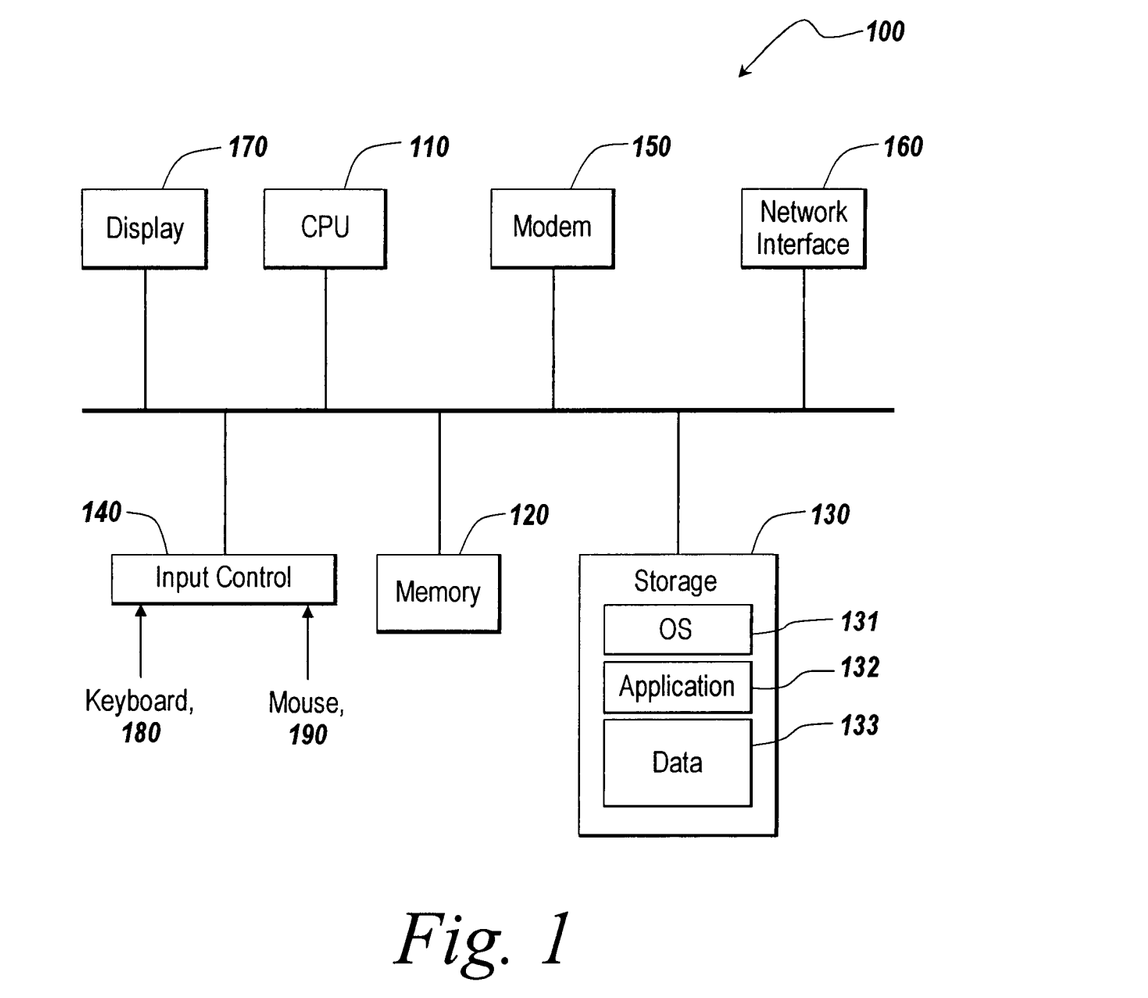
FIG. 1 shows an exemplary computing device suitable for practicing the illustrative embodiment of the present invention.

FIG. 1 is an exemplary computing device 100 suitable for practicing the illustrative embodiment of the present invention, which provides a block diagram environment. One of ordinary skill in the art will appreciate that the computing device 100 is intended to be illustrative and not limiting of the present invention. The computing device 100 may take many forms, including but not limited to a workstation, server, network computer, quantum computer, optical computer, bio computer, Internet appliance, mobile device, a pager, a tablet computer, and the like.

The computing device 100 may be electronic and include a Central Processing Unit (CPU) 110, memory 120, storage 130, an input control 140, a modem 150, a network interface 160, a display 170, etc. The CPU 110 controls each component of the computing device 100 to provide the block diagram environment. The memory 120 temporarily stores instructions and data and provides them to the CPU 110 so that the CPU 110 operates the computing device 100 and runs the block diagram environment. The storage 130 usually contains software tools for applications. The storage 130 includes, in particular, code 131 for the operating system (OS) of the device 100, code 132 for applications running on the operation system including applications for providing the block diagram environment, and data 133 for the block diagrams created in the block diagram environment. Those of ordinary skill in the art will appreciate that the application can be stored in the memory 120 as well, much like the data, and even the OS, or they can be stored on the network described below with reference to FIG. 2.

The input control 140 may interface with a keyboard 180, a mouse 190, and other input devices. The computing device 100 may receive through the input control 140 input data necessary for creating block diagrams, such as the selection of the attributes and operations of component blocks in the block diagrams. The computing device 100 may also receive through the input control 140 input data necessary for controlling the execution of the block diagrams. The computing device 100 may display in the display 170 user interfaces for the users to create or edit the block diagrams.

Figure 2:
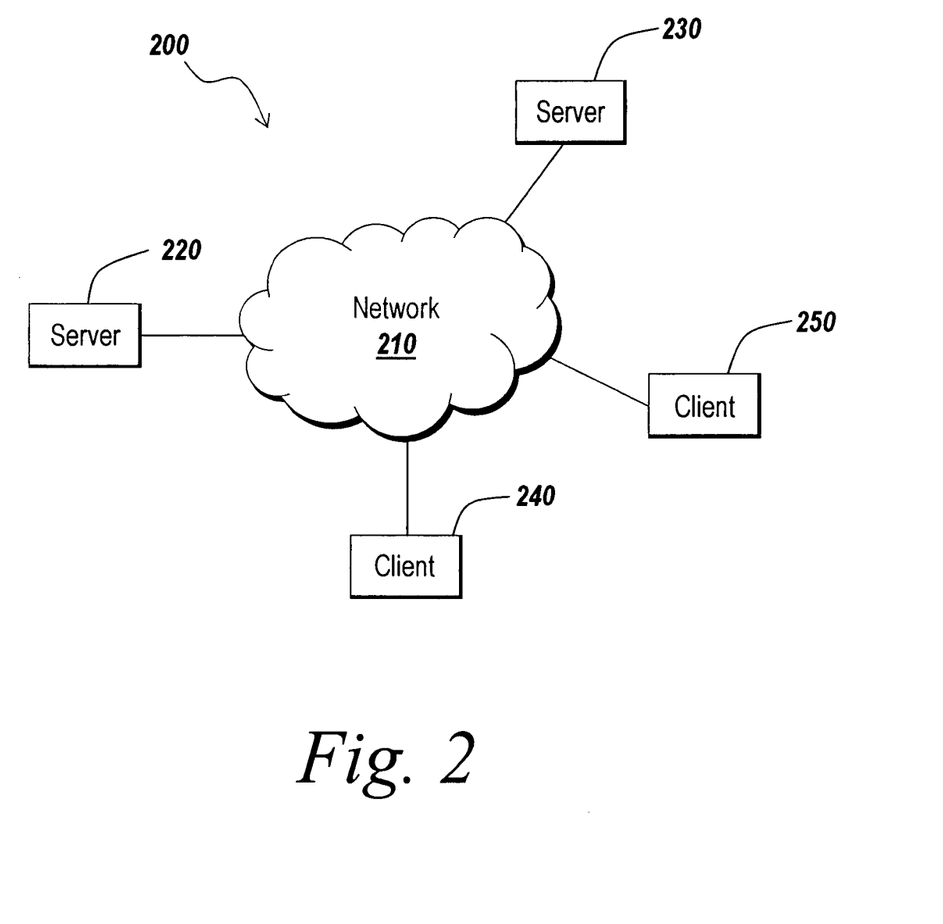
FIG. 2 shows an exemplary network environment suitable for practicing the illustrative embodiment.

FIG. 2 is an exemplary network environment 200 suitable for the distributed implementation of the illustrative embodiment. The network environment 210 may include one or more servers 220 and 230 coupled to clients 240 and 250 via a communication network 210. The network interface 160 and the modem 150 of the computing device 100 may enable the servers 220 and 230 to communicate with the clients 240 and 250 through the communication network 210. The communication network 210 may include Internet, intranet, LAN (Local Area Network), WAN (Wide Area Network), MAN (Metropolitan Area Network), wireless networks (e.g., Bluetooth, IEEE 802.11) etc. The communication facilities can support the distributed implementations of the present invention. In the network environment 200, the servers 220 and 230 may provide the clients 240 and 250 with software components or products under a particular condition, such as a license agreement. The software components or products may include those for providing a block diagram environment. The clients 240 and 250 may create block diagrams using the software components or products provided by the servers 220 and 230, and send the servers 220 and 230 the block diagrams for the execution of the block diagrams.

Optionally, the computing device 100 may include multiple CPUs for executing software loaded in the memory 120, and other programs for controlling system hardware. Each of the CPUs can be a single or multiple core processor. The code loaded in the memory 120 may run in a virtualized environment, such as in a Virtual Machine (VM). Multiple VM's may be resident on a single processor. Also, part of the application could be run in hardware, for example, by configuring a field programmable gate array (FPGA) or creating an application specific integrated circuit (ASIC).

Figure 3:
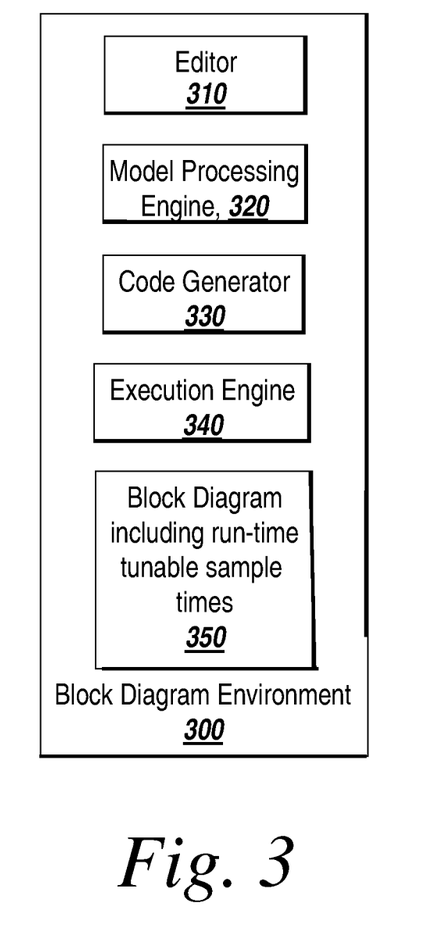
FIG. 3 depicts an exemplary block diagram environment provided in the illustrative embodiment.

FIG. 3 depicts an exemplary block diagram environment 300 provided in the illustrative embodiment. The block diagram environment 300 may include an editor 310, a model processing engine 320, a code generator 330, a model execution engine 340 and one or more block diagrams 350. An exemplary block diagram environment 300 can be provided by the software products, such as Simulink® from The Mathworks, Inc. of Natick, Mass., that cater to various aspects of dynamic system analysis and design. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the output of the dynamic system ("executing" the block diagram), and automatically producing either deployable software systems or descriptions of hardware systems that mimic the behavior of either the entire model or portions of it (referred to herein as "code generation").

The block diagram editor 310 allows users to perform such actions as draw, edit, annotate, save, and print out block diagram representations of dynamic systems. As noted earlier, blocks are the fundamental mathematical elements of a classic block diagram model. Simulink® extends the classic block diagram models by introducing the notion of two classes of blocks, non-virtual blocks and virtual blocks. Non-virtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models. Simulink® further extends the meaning of a non-virtual block to include other semantics, such as a "merge" block semantic. The merge block semantic is such that on a given time step its output is equal to the last block to write to an input of the merge block. An additional extension provided by Simulink® is the concept of conditional execution. Simulink® contains the concept of conditional and iterative subsystems that control when in time block methods execute for a sub-section of the overall block diagram.

A processing engine 320 carries out the task of compiling the block diagram to produce an "in-memory executable" version of the model that is used for generating code and/or simulating or linearizing the block diagram 350. The compile stage involves checking the integrity and validity of the block interconnections in the block diagram 350. In this stage, the engine 320 also sorts the blocks in the block diagram 350 into hierarchical lists that are used when creating the block method execution lists. In the link stage, the processing engine 320 uses the result of the compiled stage to allocate memory needed for the execution of the various components of the block diagram. The linking stage also produces block method execution lists that are used by the simulation, trimming, or linearization of the block diagram 350. The block method execution lists are generated because the simulation, trimming, and/or linearization of a model must execute block methods by type (not by block) when they have a sample hit.

The block diagram model can be trimmed to find a trim point of a dynamic system. A trim point, also known as an equilibrium point, is a point in the parameter space of a dynamic system at which the system is in a steady state. For example, a trim point of an aircraft is a setting of its controls that cause the aircraft to fly straight and level. Mathematically, a trim point is a point where the system's state derivatives equal zero. Trimming starts from an initial point and searches, using a sequential quadratic programming algorithm, until it finds the nearest trim point. A user can supply the initial point implicitly or explicitly. Trimming can find trim points that meet specific input, output, or state conditions, and it can find points where a system is changing in a specified manner, that is, points where the system's state derivatives equal specific nonzero values.

After linking has been performed, the code generator 330 may generate code. In this stage, the code generator 330 may choose to translate the block diagram model (or portions of it) into either software modules or hardware descriptions (broadly termed code). If this stage is performed, then the stages that follow use the generated code during the execution of the block diagram. If this stage is skipped completely, then the execution engine 340 uses an interpretive mode of execution for the block diagram. In some cases, the user may not proceed further with the execution of the block diagram because they would like to deploy the code outside the confines of the block diagram software. Upon reaching the simulation stage, the execution engine 340 uses a simulation loop to execute block methods in a pre-defined ordering upon a sample hit to produce the system responses as they change with time.

Figure 4:
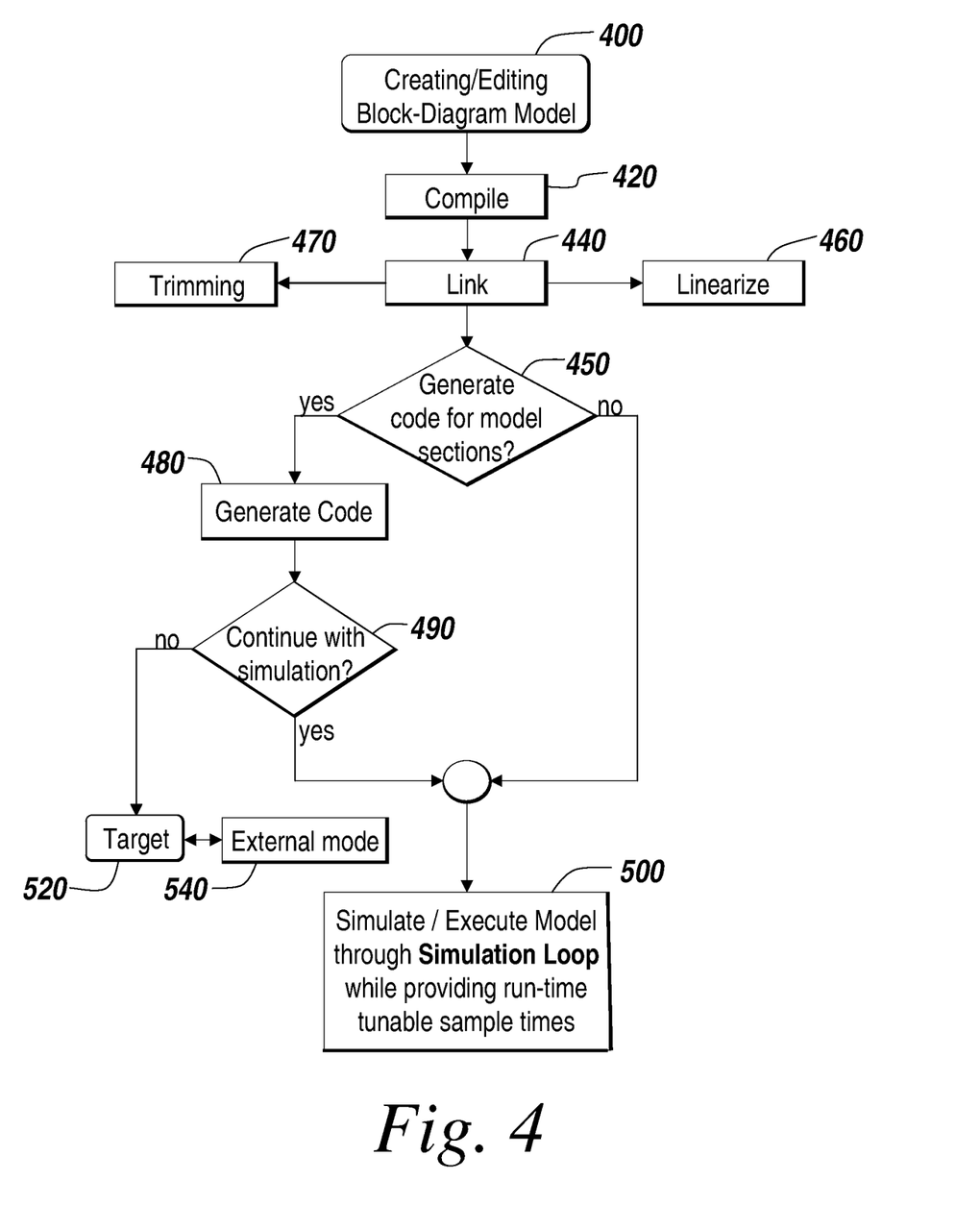
FIG. 4 is a flow chart showing an exemplary operation of the block diagram environment depicted in FIG. 3.

The interrelationship between the various stages is illustrated in a flow chart in FIG. 4. The block diagram is created/edited (step 400) and compiled (step 420). Following the compilation stage, is the model link stage (step 440) which may also produce linear models (step 460) or trim the block diagram model to find a trim point of a dynamic system of the block diagram model (step 470). Code may or may not be generated (step 450). If code is generated (step 480), a decision is made (step 490) whether to continue the simulation. If the decision is made to continue the simulation the model is simulated/executed through the Simulation Loop (step 500). If the simulation is not continued, the code may be delivered to a target (step 520) and executed in an external mode (step 540). If code is not generated the block diagram may execute in interpretive mode when entering the Simulation Loop (step 500).

Inherent in the block diagrams is the notion of system sample time. A sample-time is the time interval at which the inputs, state, or outputs (collectively referred to as the results) of components of the system evolve as time progresses. Based on sample times, a system can be described as a discrete-time system, continuous-time system or hybrid system.

A discrete-time system is a system in which the evolution of the system results is tracked at finite intervals of time. In the limit as the interval approaches zero, the discrete-time system becomes a continuous-time system. The intervals of time may be periodic or non-periodic. Sometimes, non-periodic rate systems are referred to as nonuniform-rate systems meaning that there is no periodic rate at which the response can be tracked. Nonuniform-rate systems can fall into the class of composite systems where an additional equation defines when in the future the other equations associated with the system should be evaluated. A continuous-time system is a system in which the evolutions of the system results are continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements.

Figure 5:
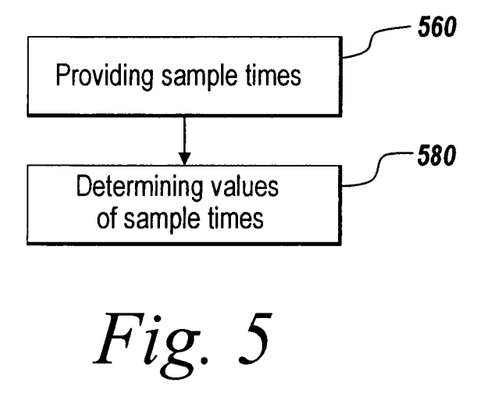
FIG. 5 is a flow chart showing an exemplary operation for providing run-time tunable sample times in the illustrative embodiment.
Figure 6A:
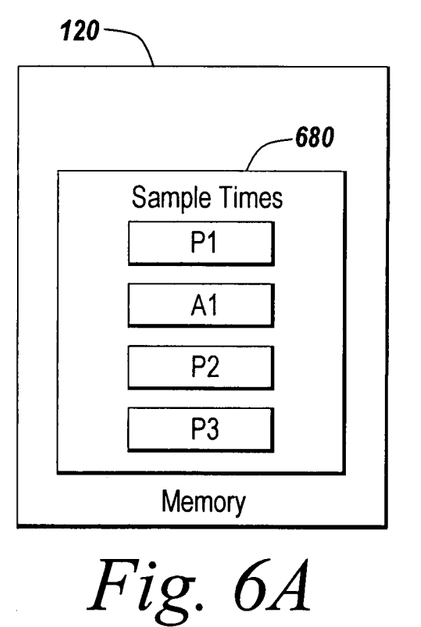
FIG. 6A depicts exemplary sample times provided in the illustrative embodiment.

If a system has only one sample time, it is said to be single-rate. If a system has multiple sample times, it is said to be multi-rate. Multi-rate systems can be evaluated (executed) using either a single-tasking form of execution or a multi-tasking form of execution. When multi-tasking execution is used, it may conform to rate monotonic scheduling principles as defined by Liu, C. L., and Layland, J. W. *Scheduling Algorithms for Multiprogramming in a Hard-Real-Time Environment*. JACM, 20, (January 1973), 46-61. Those of ordinary skill in the art will appreciate that the rate monotonic scheduler is used as one of the schedulers for multi-tasking in the illustrative embodiment, and not limiting the scope of the present invention The illustrative embodiment provides run-time tunable sample times for the block diagram. Although the illustrative embodiment is described relative to multiple sample times, one of skill in the art will appreciate that the present invention can apply to single-rate systems that have a single sample time. The run-time tunable sample times can be modified during the execution of the block diagram without recompiling the block diagram. FIG. 5 is a flow chart showing an exemplary operation for providing run-time tunable sample times in the illustrative embodiment. To make the sample times run-time tunable, the illustrative embodiment parameterizes the sample times so that the values of the sample time parameters can be changed (step 560). FIG. 6A shows exemplary sample times 680, including P1, A1, P2 and P3, provided in the illustrative embodiment. The memory 120 includes space allocated for sample times 680, such as P1, A1, P2 and P3. The values of the sample time 680 may be determined or changed during the execution of the block diagram. One of ordinary skill in the art will appreciate that the sample times 680, including P1, A1, P2 and P3, are illustrative and any number or type of sample times can be defined by a user.

Figure 6B:
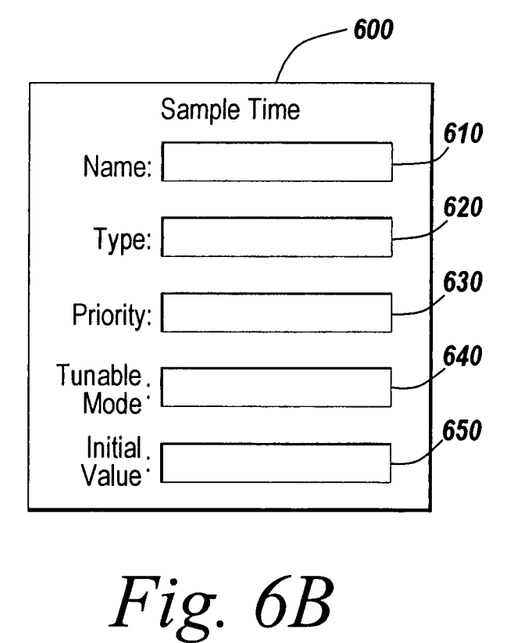
FIG. 6B is an exemplary user interface for defining the attributes of the sample times.

The illustrative embodiment enables a user to define the sample times 680. FIG. 6B is an exemplary user interface 600 for enabling the user to specify the sample times 680. The sample times 680 may include various attributes, such as Name 610, Type 620, Priority 630, Tunable Mode 540 and Initial Value 650. The following is a list of exemplary attributes of the sample times 680, including P1, A1, P2 and P3.

| Name | Type | Priority | Tunable Mode | Initial Value |
| --- | --- | --- | --- | --- |
| P1 | Periodic | 30 | Power up tunable | 1.0 |
| A1 | Asynchronous | 35 | n/a | n/a |
| P2 | Periodic | 36 | Run-time tunable | 4.0 |
| P3 | Periodic | 38 | Run-time tunable | 12.0 |

As shown in the table, the sample times 680 have the attributes of, for example, Name 610, Type 620, Priority 630, Tunable Mode 640 and Initial Value 650. The Name attribute represents each of the sample times, such as P1, A1, P2 and P3. The Type attribute indicates whether a sample hit by the sample time is periodic or asynchronous(or non-periodic). The Priority attribute specifies and assigns priorities to the sample times. The Priority attribute indicates the execution priority of the real-time task associated with the sample time. The lower values receive higher priorities. For example, P1 has the value of 30, which receives a higher priority than other sample times, such as A1 having the value of 35. Those of ordinary skill in the art will appreciate that this assumption is illustrative and the lower values can receive lower priorities in other embodiments. The Tunable Mode attribute indicates a mode or time when the sample time can be used to tune the sample time. In the table, P1 can be tuned in a power up mode and P2 and P3 can be tuned in run-time. The Initial Value attribute indicates the values of the sample times initially set by the user. One of ordinary skill in the art will appreciate that the attributes of the sample times 680 shown in the table are illustrative, and that additional attributes of the sample times can be defined by the user.

Figure 7:
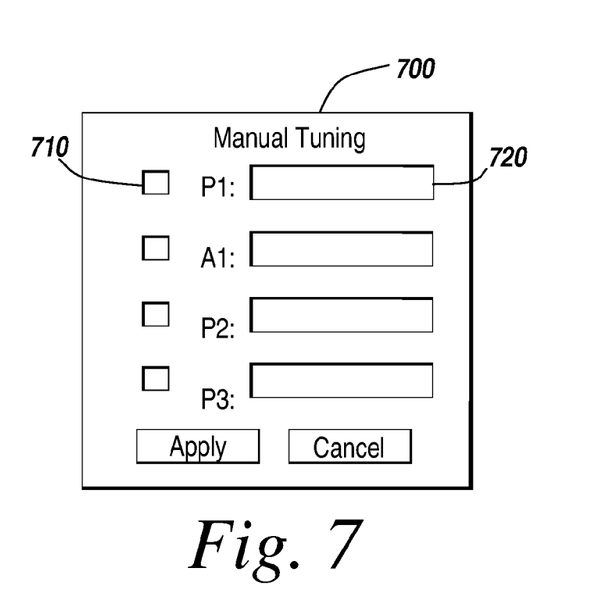
FIG. 7 is an exemplary user interface for manually tuning the sample times in the illustrative embodiment.

Referring back to FIG. 5, the values of the sample times 680 can be changed during the execution of the block diagram 350 (step 580). The illustrative embodiment may enable the user to manually tune the sample times 680 during the execution of the block diagram 350. FIG. 7 is an exemplary user interface 700 that enables the user to manually change the sample times 680 during the execution of the block diagram 350. Invoking the user interface 700 may cause the running execution of the block diagram 350 to pause. While the execution is paused, the user can check a box 710 to select a different sample time that can be used in the subsequent execution of the block diagram 350. The user may also set a new value of the sample time in the box 720 so that the new value can be used for the sample time in the subsequent execution of the block diagram. One of skill in the art will appreciate that the user interface 700 is illustrative and different types of user interfaces, such as a command line interface, can be used in other embodiments.

Figure 8:
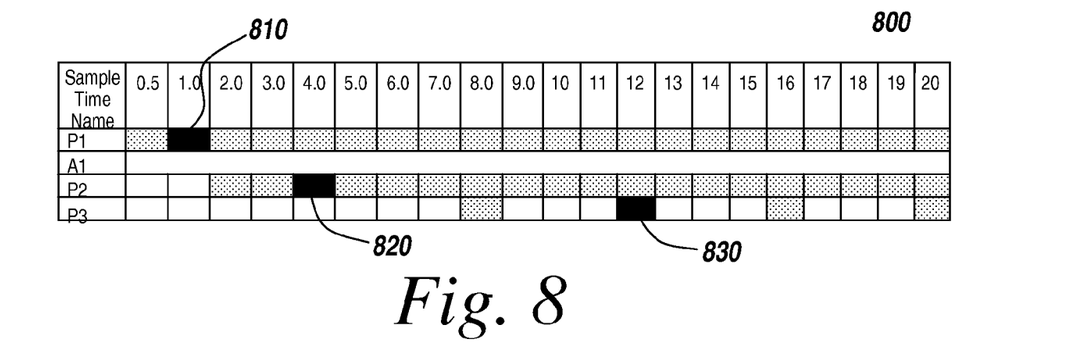
FIG. 8 is an exemplary user interface for showing the range of the sample times that ensures the stability of the system.

With the user interface 700 or separately from the user interface 700, the illustrative embodiment may also provide another user interface showing the range of the values for the sample times that ensures the stability of the system represented by the running block diagram 350. FIG. 8 is an exemplary user interface 800 that shows the range of the values of the sample times, including P1, A1, P2 and P3, that ensures the stability of the system represented by the block diagram 350. The user interface 800 shows that the sample time P1 is currently set to 1.0 (indicated by a box 810) and can be set to any value from 0.5 to 20 for the stability of the system. The user interface 800 also shows that the sample time P2 is currently set to 4.0 (indicated by a box 820) and can be set to any value from 2.0 to 20. The user interface 800 further shows that the sample time P3 is currently set to 12.0 (indicated by a box 830) and can be set to any of 8.0, 12, 16 and 20. The user interface 800 shows that the valid P3 values are an integer multiple of the current P2 value, which may indicate that there is a data transfer between the portions of the block diagram executed at the sample times P2 and P3, respectively. This may be required by the rate monotonic scheduling principles described above. In the illustrative embodiment, the sample times satisfy system scheduling requirements and cannot change randomly. Those of ordinary skill in the art will appreciate the rate monotonic scheduler is used to describe an illustrative embodiment of the present invention and not limiting the scope of the present invention. Rather, the present invention can be used to implement rules or constraints of different schedulers.

The system stability is an exemplary requirement that the range of the values of the sample times meets in the user interface 800. In other embodiments, the user interface 800 can show a range of the values of the sample times that meets other predetermined requirements, such as a constraint of system hardware.

Figure 9:
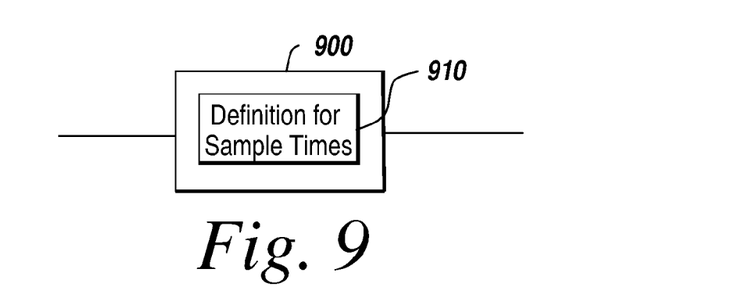
FIG. 9 shows an exemplary sample time tuning block that automatically tunes the sample time in the block diagram.

The illustrative embodiment may enable the user to automatically tune the sample time during the execution of the block diagram. The sample time may be automatically tuned by programmatically defining when and how the sample times change. Sample time changes can be signal driven, event driven, or time driven. For example, sample times can change during system power up, when a specific event comes, or they can constantly change. The illustrative embodiment may provide a sample time tuning block to decide when and how sample time is tuned. FIG. 9 is an exemplary sample time tuning block 900 that enables the automatic tuning of the sample times 680 during the execution of the block diagram 350. The sample time tuning block 900 includes a definition 910 that specifies when and how the sample times 680 are changed. The definition 910 determines when and how the sample times 680 are tuned or determined. For example, with reference to the table described above, the user can define that the sample times 680 can be tuned during system power up, or when specific events come. The sample time tuning block 900 may include inputs for receiving the specific events and outputs for delivering the sample times 680. The sample time tuning block 900 can be placed in the block diagram 350 to tune the sample time for the block diagram or connected to specific blocks to tune the sample time of the specific blocks in the block diagram.

Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any modeling environments. Practitioners of the art will realize that the sequence of steps and architectures depicted in the figures may be altered without departing from the scope of the present invention and that the illustrations contained herein are singular examples of a multitude of possible depictions of the present invention.

What is claimed is:

1. A computer implemented method for providing a tunable sample time for use in a representation of a dynamic system, the method comprising:
    compiling the representation of the dynamic system to generate a compiled representation of the dynamic system, the compiled representation of the dynamic system having an initial value for the tunable sample time;
    receiving an input value, the input value:
        received after compiling the representation of the dynamic system,
        representing an input,
        being a value for the tunable sample time, and
        differing from the initial value;
    tuning the tunable sample time with a computing device, the tuning:
        occurring during a simulation of the dynamic system, and
        changing the initial value of the tunable sample time to the input value to produce a tuned sample time;
    generating an in-memory executable using the representation of the dynamic system; and
    maintaining the in-memory executable when tuning the tunable sample time.

2. The method of claim 1, wherein the representation of the dynamic system comprises at least one of a simulation of a physical system generated in a modeling environment, generated code generated in a modeling environment, generated code generated in a programming environment, and a simulation generated in a programming environment.

3. The method of claim 2, wherein the act of maintaining the in-memory executable comprises preserving compiled information to perform at least one of generate code, simulate the representation of the dynamic system, and linearize the representation of the dynamic system.

4. The method of claim 1, further comprising providing at least one parameter related to the tunable sample time, wherein the act of providing at least one parameter related to the tunable sample time further comprises the act of providing for a definition of attributes for a parameterized sample time.

5. The method of claim 4, wherein the attributes comprise at least one of a priority, a tunability, and an initial value of the tunable sample time.

6. The method of claim 4, further comprising the act of determining the tunable sample time automatically.

7. The method of claim 6, further comprising an act of determining a range of values for the tunable sample time that meet a predetermined requirement.

8. The method of claim 6, wherein the act of determining the tunable sample time automatically includes determining the tunable sample time based on at least one of an attribute of the parameterized sample time, a signal, an event, a time, and a rule.

9. The method of claim 1, further comprising an act of validating the representation of the dynamic system.

10. The method of claim 9, wherein the act of validating the representation of the dynamic system further comprises an act of determining whether the tunable sample time meets a predetermined criteria.

11. The method of claim 10, wherein the predetermined criteria comprises at least one of a system stability requirement, a system hardware constraint, a scheduler requirement, and an attribute requirement.

12. The method of claim 1, wherein the act of tuning the tunable sample time further comprises an act of providing for tuning of the tunable sample time during run-time of the representation of the dynamic system.

13. The method of claim 12, further comprising an act of optimizing the value of the tunable sample time.

14. A system for providing a tunable sample time for use in a compiled representation of a dynamic system, the system comprising:
a storage element to store the compiled representation of the dynamic system, the compiled representation of the dynamic system having an initial value for the tunable sample time; and
a processor to:
receive an input value, the input value:
received after compiling the representation of the dynamic system,
representing an input,
being a value for the tunable sample time, and
differing from the initial value;
provide a sample time tuning element for tuning the tunable sample time, the tuning:
occurring during run-time of the representation of the dynamic system, and
changing the initial value of the tunable sample time to the input value to produce a tuned sample time;
provide an in-memory executable generated using the representation of the dynamic system;
maintain the in-memory executable during tuning of the tunable sample time;
provide a compiler element to compile the representation of the dynamic system into the compiled representation of the dynamic system; and
provide a simulation engine to simulate the compiled representation of the dynamic system, wherein simulating the compiled representation of the dynamic system comprises tuning the tunable sample time.

15. The system of claim 14, wherein the processor further maintains the in-memory executable generated from the representation of the dynamic system during tuning of the tunable sample time by preserving compiled information used in at least one of generating code, simulating the representation of the dynamic system, and linearizing the representation of the dynamic system.

16. The system of claim 14, wherein the storage element further stores a parameter related to the tunable sample time, and further stores attributes related to a parameterized sample time.

17. The system of claim 16, wherein the attributes comprise at least one of a priority, a tunability, and an initial value of the tunable sample time.

18. The system of claim 16, wherein the sample time tuning element further determines the tunable sample time automatically.

19. The system of claim 18, wherein the sample time tuning element further determines a range of values for the tunable sample time that meets a predetermined requirement.

20. The system of claim 18, wherein the sample time tuning element further determines at least one sample time based on at least one of attributes of the tunable sample time, a signal, an event, a time, and a rule.

21. The system of claim 14, further comprising a validation element to validate that the tunable sample time meets a predetermined criteria.

22. The system of claim 21, wherein the predetermined criteria comprises at least one of a system event requirement, a system signal requirement, a system hardware constraint, a scheduler requirement, and an attribute requirement.

23. The system of claim 14, further comprising an optimization element to optimize the tunable sample time based on system performance, system stability, system defined preference, and user defined preference.

24. A non-transitory computer readable storage medium storing computer readable instructions that, when executed by a computer, cause the computer to provide a tunable sample time in a compiled representation of a dynamic system, the tunable sample time having an initial value, the instructions comprising instructions for:
receiving an input value, the input value:
received after compiling the representation of the dynamic system,
representing an input,
being a value for the tunable sample time, and
differing from the initial value;
tuning the tunable sample time with a computer, the tuning:
occurring during a simulation of the representation of the dynamic system, and
changing the initial value of the tunable sample time to the input value to produce a tuned sample time;
providing an in-memory executable generated using the representation of the dynamic system; and
maintaining the in-memory executable during tuning of the tunable sample time.

25. The computer readable storage medium of claim 24, wherein the representation of the dynamic system comprises at least one of a simulation of a physical system generated in a modeling environment, generated code generated in a modeling environment, generated code generated in a programming environment, and a simulation generated in a programming environment.

26. The computer readable storage medium of claim 25, wherein the instructions for maintaining the in-memory executable further comprise instructions for preserving compiled information for performing at least one of generate code, simulate the representation of the dynamic system, and linearize the representation of the dynamic system.

27. The computer readable storage medium of claim 24, further holding instructions for providing at least one parameter related to the tunable sample time, wherein the instructions for providing at least one parameter related to the tunable sample time further comprise the act of providing for a definition of attributes for a parameterized sample time.

28. The computer readable storage medium of claim 27, wherein the attributes comprise at least one of a priority, a tunability, and an initial value of the parameterized sample time.

29. The computer readable storage medium of claim 27, wherein the instructions further comprise instructions for determining the tunable sample time automatically.

30. The computer readable storage medium of claim 29, further holding instructions for determining a range of values for the tunable sample time that meet a predetermined requirement.

31. The computer readable storage medium of claim 29, wherein the instructions for determining the tunable sample time automatically include instructions for determining the at least one sample time based on at least one of an attribute of the parameterized sample time, a signal, an event, a time, and a rule.

32. The computer readable storage medium of claim 24, further storing instructions for validating the representation of the dynamic system.

33. The computer readable storage medium of claim 32, wherein instructions for validating the representation of the dynamic system further comprise instructions for an act of determining whether the tunable sample time meets a predetermined criteria.

34. The computer readable storage medium of claim 33, wherein the predetermined criteria comprises at least one of a system stability requirement, a system hardware constraint, a scheduler requirement, and an attribute requirement.

35. The computer readable storage medium of claim 24, further storing instructions for optimizing the value of the tunable sample time.

36. The computer readable storage medium of claim 35, wherein the instructions for optimizing the value of the tunable sample time include instructions for optimizing the sample time based on at least one of system performance, system stability, system defined preference, and user defined preference.

* * * * *